United States Patent
Cravens et al.

(10) Patent No.: US 7,256,993 B2
(45) Date of Patent: Aug. 14, 2007

(54) ADJUSTABLE HEAT SINK SHROUD

(75) Inventors: Zachary A. Cravens, Round Rock, TX (US); Eric C. Wobig, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 45 days.

(21) Appl. No.: 10/818,198

(22) Filed: Apr. 5, 2004

(65) Prior Publication Data

US 2005/0219813 A1    Oct. 6, 2005

(51) Int. Cl.
*H05K 7/20* (2006.01)

(52) U.S. Cl. ............ 361/690; 361/694; 361/695; 361/697; 165/80.3; 165/104.33; 454/184

(58) Field of Classification Search ........... 361/690, 361/688, 694–695, 697; 165/80.3, 104.33; 454/184, 313

See application file for complete search history.

(56) References Cited

U.S. PATENT DOCUMENTS

| | | | |
|---|---|---|---|
| 5,546,272 A | 8/1996 | Moss et al. ............... 361/687 |
| 5,572,403 A | 11/1996 | Mills ........................ 361/695 |
| 5,597,035 A | 1/1997 | Smith et al. ............... 165/80.3 |
| 5,793,610 A | 8/1998 | Schmitt et al. ............ 361/695 |
| 5,828,549 A | 10/1998 | Gandre et al. ............. 361/695 |
| 5,912,802 A * | 6/1999 | Nelson ...................... 361/695 |
| 5,936,836 A * | 8/1999 | Scholder ................... 361/695 |
| 6,094,346 A * | 7/2000 | Schweers et al. .......... 361/695 |
| 6,113,485 A * | 9/2000 | Marquis et al. ........... 454/184 |
| 6,155,920 A * | 12/2000 | Pan et al. .................. 454/184 |
| 6,175,493 B1 | 1/2001 | Gold ......................... 361/687 |
| 6,288,898 B1 | 9/2001 | Johnson et al. ............ 361/687 |
| 6,292,361 B1 | 9/2001 | Johnson et al. ............ 361/687 |
| 6,351,380 B1 | 2/2002 | Curlee et al. .............. 361/695 |
| 6,359,780 B1 | 3/2002 | McMahan et al. ......... 361/687 |
| 6,396,688 B1 | 5/2002 | Davies et al. .............. 361/687 |
| 6,556,440 B2 | 4/2003 | Jensen et al. .............. 361/687 |
| 6,621,700 B1 * | 9/2003 | Roman et al. ............. 361/697 |
| 6,643,131 B1 * | 11/2003 | Huang ....................... 361/697 |
| 6,678,157 B1 * | 1/2004 | Bestwick ................... 361/695 |
| 6,711,013 B2 | 3/2004 | Wobig et al. .............. 361/687 |
| 6,736,196 B2 * | 5/2004 | Lai et al. ................... 165/122 |
| 6,744,630 B2 | 6/2004 | Hutchinson et al. ....... 361/687 |
| 6,791,837 B2 * | 9/2004 | Chen et al. ................ 361/695 |
| 6,822,863 B1 * | 11/2004 | Artman et al. ............. 361/695 |
| 6,930,882 B2 * | 8/2005 | Broder et al. .............. 361/695 |
| 7,050,300 B2 * | 5/2006 | Hein ......................... 361/695 |
| 2004/0095723 A1 * | 5/2004 | Tsai et al. .................. 361/695 |

* cited by examiner

*Primary Examiner*—Michael Datskovsky
*Assistant Examiner*—Robert J. Hoffberg
(74) *Attorney, Agent, or Firm*—Baker Botts L.L.P.

(57) ABSTRACT

An adjustable heat sink shroud includes an insert that may be included within the interior of the heat sink shroud depending on the size of the heat sink enclosed within the shroud. The presence of the insert directs the flow of air through the heat sink.

19 Claims, 4 Drawing Sheets

ADJUSTABLE HEAT SINK SHROUD

TECHNICAL FIELD

The present disclosure relates generally to the field of computer or information systems, and, more particularly, to an interlocking heat sink.

BACKGROUND

As the value and use of information continues to increase, individuals and businesses continually seek additional ways to process and store information. One option available to users of information is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems, including computer systems, typically include at least one microprocessor, memory, and various input and output devices. The power consumed by a microprocessor typically generates heat in the interior of the computer system. As computer systems grow in speed and shrink in size, issues of heat dissipation and component spacing in the interior of the computer system become more important. The heat generated by a microprocessor is especially problematic. Because a typical microprocessor does not have a physical structure to remove the heat generated by the microprocessor, many computer systems include a heat sink that is placed near the microprocessor to dissipate the heat generated by the microprocessor. Heat sinks are used to draw heat away from the microprocessor and the motherboard. In many configurations, the heat sink is placed on the surface of the microprocessor package and physically rests on the microprocessor.

As an aid in heat dissipation, a fan is sometimes positioned adjacent to the heat sink. The rotation of the fan produces an air flow that draws air through the fins of the heat sink, cooling the heat sink and aid the transfer of heat away from the microprocessor. Depending on the physical configuration of the heat sink itself, the placement of a fan adjacent the heat sink may be insufficient to draw air through the fins of the heat sink. As an example, if the fins of the heat sinks are spaced too closely together, the air pressure between adjacent fins may prevent directed air from flowing between the fins. In this configuration, the air flow path may travel around the heat sink. Because the air flow path is not through the fins of the heat sink, the effectiveness of the heat sink and its adjacent fan is limited.

One technique for limiting directed air flow around a heat sink involves the placement of a shroud or collar over both the heat sink and the fan. The use of a shroud is intended to limit the air flow path so that the directed air is forced through the fins of the heat sink. If the shroud is not sized correctly, however, the air flow may not be directed through the heat sink. A gap between the shroud and the heat sink may allow the directed air, depending on the pressure differentials existing within the shroud, to flow through the gap and around the heat sink.

Heat sinks vary in size, depending on the heat dissipation requirements of the heat sink, the space configuration of the computer system, and other factors. For a low power processor, a less expensive and smaller heat sink may produce adequate heat dissipation at a lower overall cost to the manufacturer and consumer. For a higher power processor, a more expensive and typically larger heat sink may be required to dissipate the heat produced by the processor. Providing a shroud that is sized to fit each possible microprocessor-heat sink combination for a given computer system design or chassis design will complicate the manufacturing process, as a variety of shroud sizes will be required, complicating the manufacturing and component procurement process.

SUMMARY

In accordance with the present disclosure, an adjustable heat sink shroud is disclosed. Depending on the size of the heat sink enclosed by the shroud, an insert may be placed in the heat sink to restrict the size and location of the air passageway within the shroud so that the flow of air through the shroud is directed through the heat sink within the shroud. A technical advantage of the present disclosure is the use of a shroud that forces air through the heat sink regardless of the size of the heat sink. Because the size of the air passageway may be adjusted through the insertion of the insert, air cannot travel around or over the heat sink. Rather, the forced air traveling through the shroud must travel through the fins of the heat sink. Another technical advantage of the adjustable heat sink shroud disclosed herein is that the shroud may, through the use of inserts of many sizes, accommodate heat sinks of many sizes. As a result, during the manufacturing process, only a single model of shroud is necessary, regardless of the size or complexity of the heat sinks involved in the design of the computer system or information handling system. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a person computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components. The processors or others sources of heat within the information handling system may require the use of a beat sink to remove heat generated by the heat source.

Figure 1:
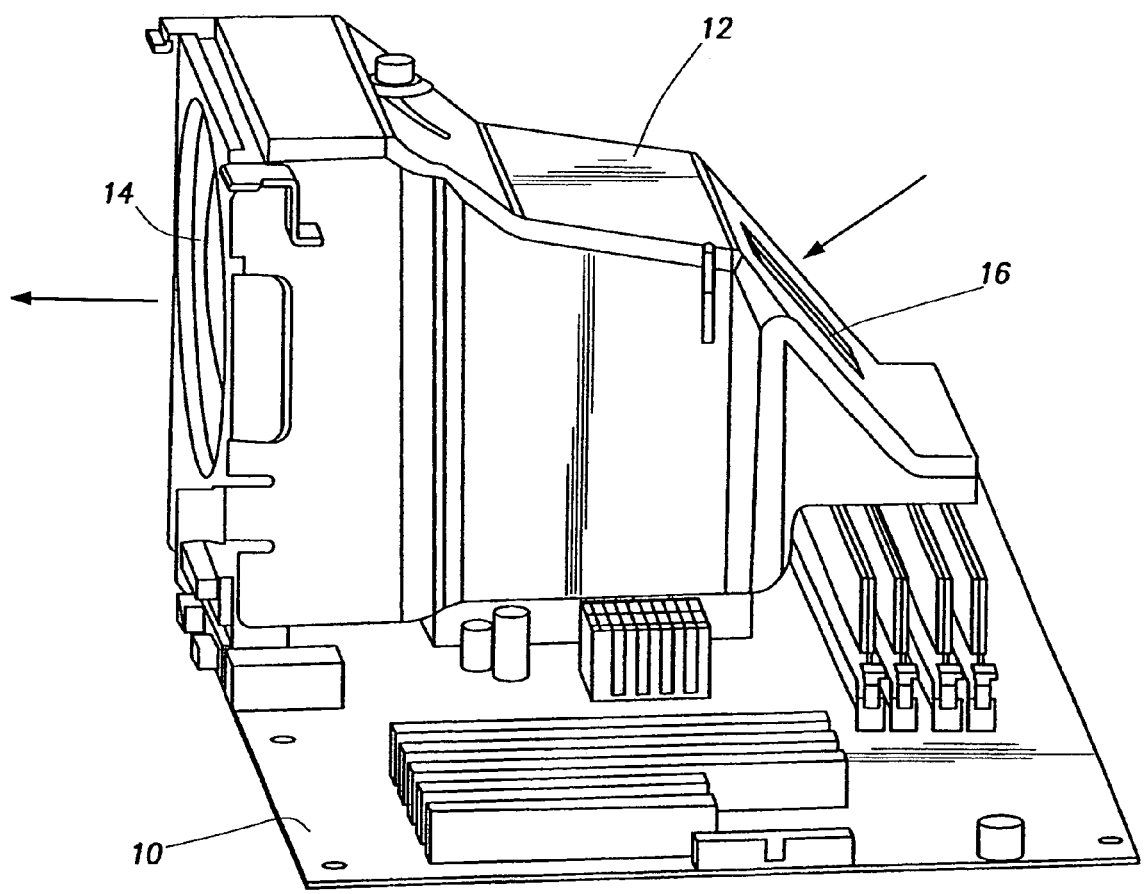
FIG. 1 is a pictorial view of a printed circuit board with an adjustable heat sink shroud thereon.
Figure 2:
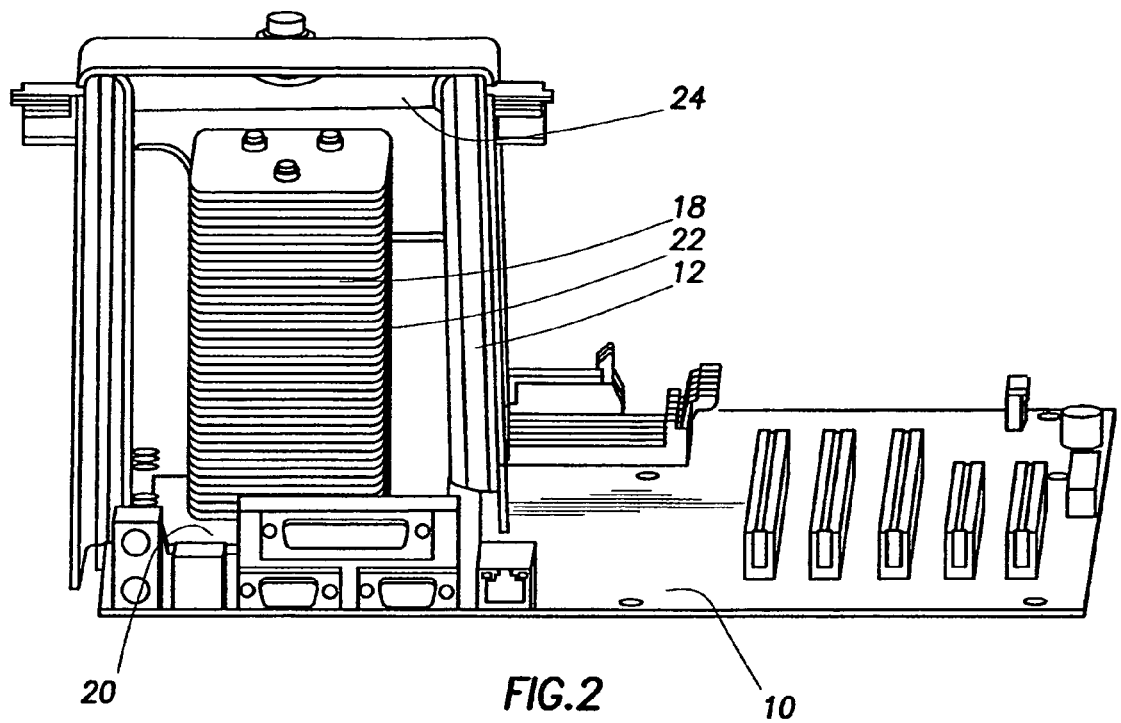
FIG. 2 is a front view of the interior of an adjustable heat sink shroud, which is shown without a fan and with a larger heat sink.

FIG. 1 is a pictorial view of a printed circuit board or motherboard 10 of a computer system. A shroud 12 is located on circuit board 10. Positioned within shroud 12 is a fan 14 at one end of the shroud. When fan 14 is turned on, air is drawn into the interior of the shroud through a distal opening 16 and directed through the interior of the shroud in the direction of the arrows of FIG. 1. Shown in FIG. 2 is a pictorial view of the interior of the shroud 12. Fan 14 is removed from the shroud 12 of FIG. 2, but would otherwise be placed in the viewable opening of the shroud 12 of FIG. 2. The air passageway of the shroud is formed by the printed circuit board and the top surface, and side surfaces of the shroud. Within the shroud is a heat sink 18 that rests on the top surface of a processor 20. Heat sink 18 includes a number of fins 22.

Figure 3:
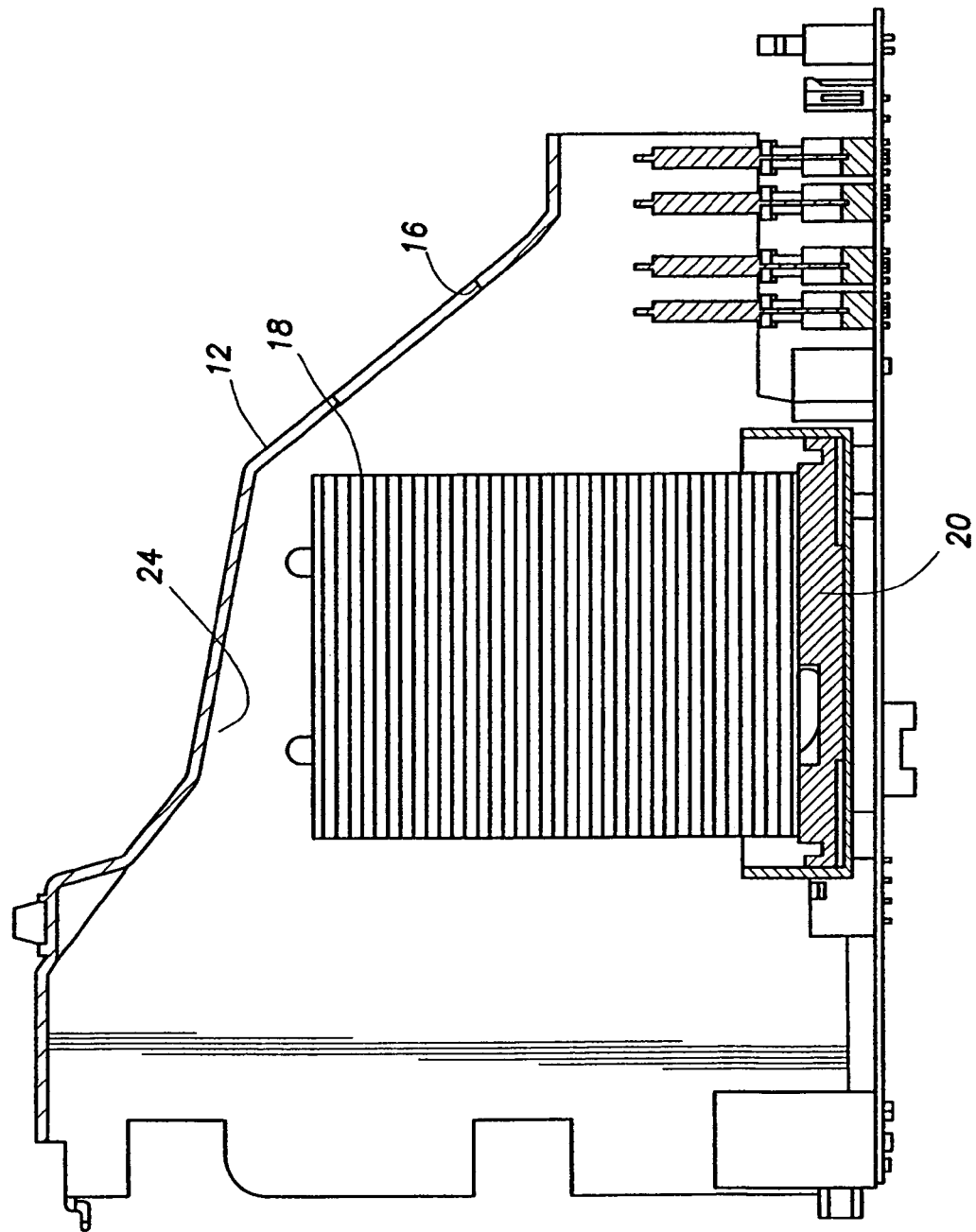
FIG. 3 is a side view in cross section of the adjustable heat sink shroud of FIG. 2.

As can be seen from FIG. 2, the physical dimensions of heat sink 18 largely correspond to the interior dimension of shroud 12 such that there is not a sizeable gap between heat sink 18 and the interior surfaces of shroud 12. In particular, the top of heat sink 18 is proximate the interior top surface 24 of shroud 12. Shown in FIG. 3 is a side view of the shroud 12 and heat sink 18 of FIG. 1. When the fan is activated, air flows through the internal air passageway of the shroud 12. As can be seen from FIG. 3, the lack of a substantial gap between the top surface of the heat sink 18 and the interior top surface 24 of shroud 12 limits the directed air from flowing over the top surface of the heat sink 18. Instead, the directed air is forced through the fins of heat sink 18. The shroud and the insert may be formed of a plastic material that does not excessively absorb heat.

Figure 4:
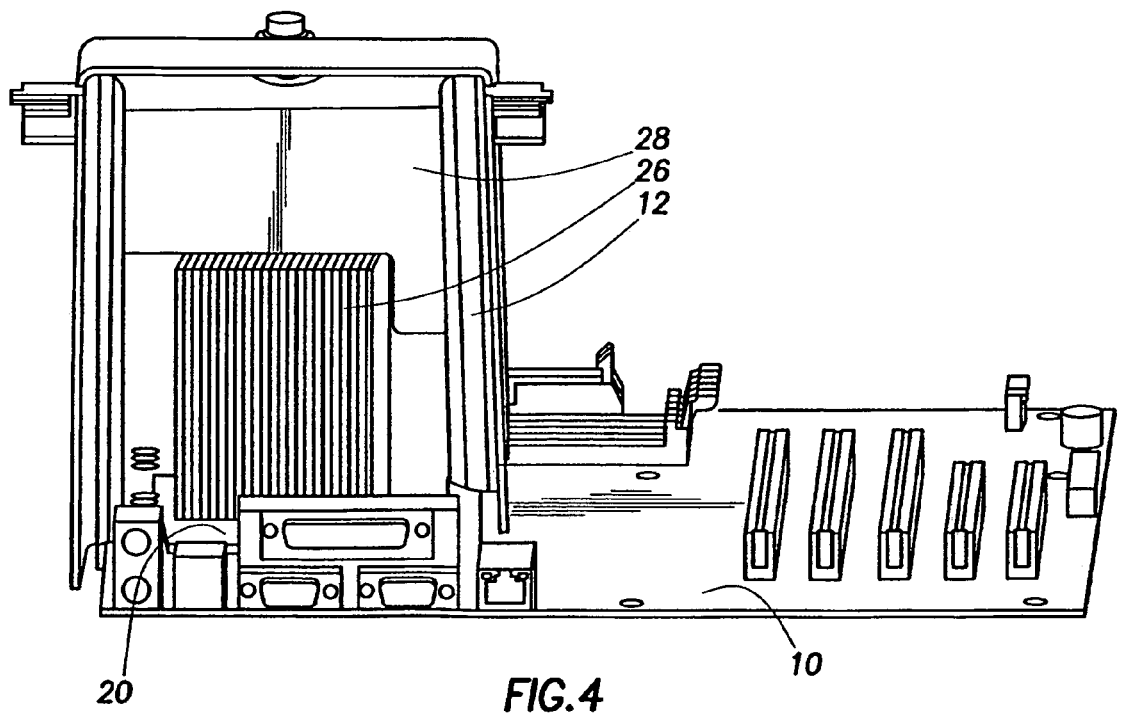
FIG. 4 is a front view of the interior of an adjustable heat sink shroud, which is shown without a fan and with a smaller heat sink.

Shown in FIG. 4 is a second pictorial view of the interior of the shroud 12. Like FIG. 2, fan 14 has been removed from shroud 12, but would otherwise be present in the viewable opening in shroud 12. Like FIG. 2, FIG. 4 depicts a heat sink 26 that is placed on the top surface of a processor 20. The heat sink 26 of FIG. 4 is shorter in height as compared to the heat sink of FIG. 2. To accommodate the size of heat sink 26 of FIG. 4, a divider or insert 28 is placed within shroud 12. The divider is placed proximate the interior top surface of shroud 12 to eliminate or substantially reduce the gap between the top surface of shroud 12 and the interior top surface of heat sink 26. Because there is not a large gap between the top surface of heat sink 26 and the interior top surface of shroud 12, there is not a low-pressure path for the flow of directed air over the top of heat sink 26. Instead, the presence of divider 28 blocks the flow of directed air over the top of heat sink 26, thereby forcing the flow of directed air through the fins of heat sink 26.

Figure 5:
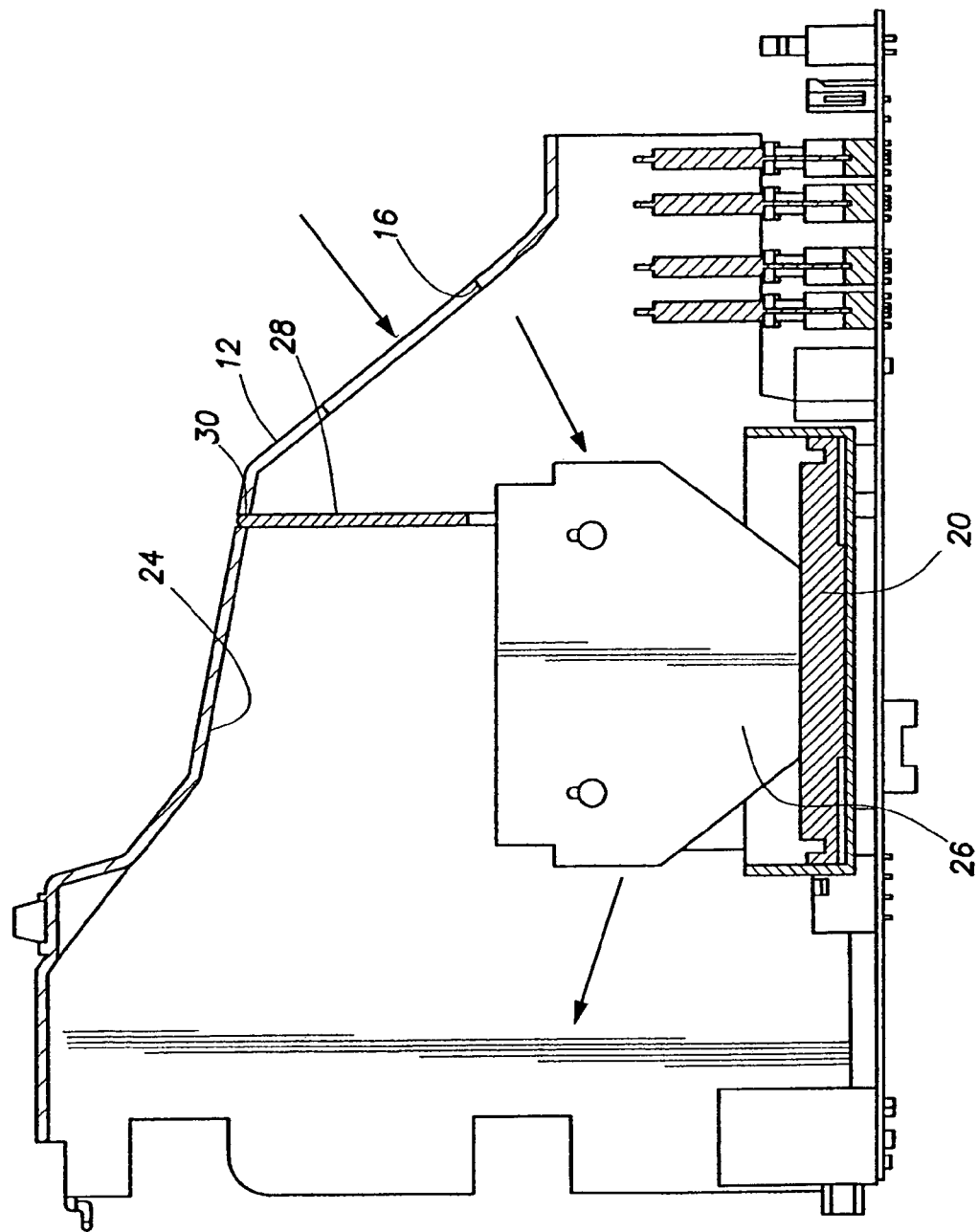
FIG. 5 is a side view in cross section of the adjustable heat sink shroud of FIG. 4.

A side view of the shroud 12 and heat sink 26 of FIG. 4 is shown in FIG. 5. Divider 28 is secured at a notch 30 in the interior top surface 24 of shroud 12. Air flow through shroud 12 is in the direction of the arrows shown in FIG. 5. As can be seen from the side view of FIG. 5, the presence of the divider blocks the directed air from flowing over the top of the heat sink and instead forces air through the heat sink. Because the divider is inserted into the shroud, the cross-sectional area of the air passageway approximates in size and location the cross-sectional area of the heat sink within the shroud.

The use of an adjustable heat sink shroud reduces the manufacturing costs of the computer system manufacturer. The computer system manufacturer can accommodate larger, more expensive heat sinks and smaller, less expensive heat sinks within a single design for the circuit board and chassis of the computer system. The difference in the design of a computer system having a larger heat sink and a computer system having a smaller heat sink is the placement of a single divider in the shroud in the case of a smaller heat sink. As such, during the manufacturing process, the manufacturer need only keep a number of inexpensive dividers on hand, while using a single size of shroud for multiple heat sink configurations. The shroud and divider combination described herein is not limited in its application to only two sizes of heat sinks. Instead, a divider may be fashioned, if necessary, for each heat sink that is smaller in size than the maximum size permitted by the shroud.

It should be recognized that the apparatus described herein is not limited in its application to processors included within a computer system. Rather, the adjustable shroud described herein may be used for heat dissipation with any heat-generating device in any larger system. It should also be recognized that the Adjustable heat sink shroud disclosed herein is not limited in its application to computer systems, but may be employed to dissipate heat in any information handling system. Although the present disclosure has been described in detail, it should be understood that various changes, substitutions, and alterations can be made hereto without departing from the spirit and the scope of the invention as defined by the appended claims.

What is claimed is:

1. A shroud for a heat sink comprising:
an air inlet formed in the distal end of the shroud;
a fan disposed in an air outlet, wherein the air outlet is opposite the air inlet; and
a detachable insert coupled to a surface of the shroud, wherein the detachable insert is sized to direct forced air through the heat sink.

2. The shroud for a heat sink of claim 1, wherein the insert is coupled to the top interior surface of the shroud.

3. The shroud for a heat sink of claim 2, wherein the insert is sized such that the width of the insert is comparable to the width of the air passageway through the shroud.

4. The shroud for a heat sink of claim 2, wherein the insert is sized such that, when coupled to the shroud, the lower portion of the insert is proximate the heat sink.

5. The shroud for a heat sink of claim 2, wherein the insert is coupled to the top surface of the shroud at a groove formed in the interior top surface of the shroud.

6. The shroud for a heat sink of claim 5, wherein the insert, when inserted extends from the interior top surface of the shroud to a location proximate the heat sink, whereby forced air is directed to the heat sink and away from interior regions of the shroud not occupied by the heat sink.

7. The shroud for a heat sink of claim 6, wherein the shroud and the insert of the shroud are formed of a plastic.

8. A method for installing a shroud in an information handling system having a heat sink, comprising the steps of:
providing the shroud, the shroud being sized to accommodate the heat sink, wherein the size of the heat sink is one of multiple sizes, wherein the shroud is sized to accommodate the heat sink of the largest size;
coupling a detachable insert within the shroud if the heat sink is of a size that is smaller than the largest size; and
installing the shroud in a location proximate the heat sink such that forced air travelling through the shroud is directed to flow through the heat sink and wherein the sizing of the shroud and the detachable insert, if included, limits the forced air from travelling around the heat sink.

9. The method for installing a shroud in an information handling system having a heat sink of claim 8, wherein the step of coupling a detachable insert within the shroud comprises the step of coupling the detachable insert within the shroud such that that the detachable insert extends from the interior top surface of the shroud to the a location proximate the top of the heat sink.

10. The method for installing a shroud in an information handling system having a heat sink of claim 9, wherein the step of coupling a detachable insert within the shroud comprises the step of coupling the detachable insert in a groove formed in the interior top surface of the shroud.

11. The method for installing a shroud in an information handling system having a heat sink of claim 8, wherein the step of providing the shroud comprises the step of providing a shroud sized such that the top interior surface of the shroud is proximate the top surface of the heat sink of the largest size.

12. The method for installing a shroud in an information handling system having a heat sink of claim 8, further comprising the step of installing a fan at an air outlet of the shroud.

13. The method for installing a shroud in an information handling system having a heat sink of claim 12, wherein the shroud and the insert are formed of a plastic.

14. A shroud for use in enclosing a heat sink in an information handling system, comprising:
an air passageway formed by the interior top surface and interior side surfaces of the shroud;
an opening formed in one distal end of the shroud;
a fan within an opening on the opposite distal end of the shroud; and
a detachable insert, wherein the insert may be removed from or inserted into the shroud so that the cross-sectional area of the air passageway at the location of the insert approximates in size and location the cross-sectional area of the heat sink within the shroud.

15. The shroud of claim 14, wherein the detachable insert is coupled to the interior top surface of the shroud and extends from the interior top surface of the shroud to a position proximate the heat sink that is enclosed by the shroud.

16. The shroud of claim 15, wherein the insert is detachably coupled to a groove formed in the interior top surface of the shroud.

17. The shroud of claim 14, wherein the shroud and the detachable insert of the shroud are formed of a plastic.

18. The shroud of claim 14, further operable to accept one of multiple inserts, each insert being sized to accommodate a heat sink of a corresponding size.

19. The shroud of claim 14, wherein the distance between the sides of the shroud is substantially the same as the width of the heat sink enclosed within the shroud.

* * * * *